(12) United States Patent
Fukasaku et al.

(10) Patent No.: US 10,468,403 B2
(45) Date of Patent: Nov. 5, 2019

(54) SEMICONDUCTOR INTEGRATED CIRCUIT AND CONTROL METHOD THEREOF

(71) Applicant: SONY CORPORATION, Tokyo (JP)

(72) Inventors: Katsuhiko Fukasaku, Kanagawa (JP); Daisuke Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/061,900

(22) PCT Filed: Dec. 22, 2016

(86) PCT No.: PCT/JP2016/088377
§ 371 (c)(1),
(2) Date: Jun. 13, 2018

(87) PCT Pub. No.: WO2017/119316
PCT Pub. Date: Jul. 13, 2017

(65) Prior Publication Data
US 2018/0374840 A1 Dec. 27, 2018

(30) Foreign Application Priority Data

Jan. 5, 2016 (JP) ................................. 2016-000524

(51) Int. Cl.
*H01L 27/02* (2006.01)
*H01L 21/822* (2006.01)
(Continued)

(52) U.S. Cl.
CPC ........ *H01L 27/0274* (2013.01); *H01L 21/822* (2013.01); *H01L 23/60* (2013.01);
(Continued)

(58) Field of Classification Search
CPC ... H01L 27/02; H01L 27/027; H01L 27/0274; H01L 27/0277; H01L 27/028;
(Continued)

(56) References Cited

U.S. PATENT DOCUMENTS

2005/0013073 A1  1/2005 Cheng et al.
2006/0087781 A1  4/2006 Ishizuka et al.
(Continued)

FOREIGN PATENT DOCUMENTS

CN    1780146 A    5/2006
CN    102969310 A  3/2013
(Continued)

OTHER PUBLICATIONS

International Search Report and Written Opinion of PCT Application No. PCT/JP2016/088377, dated Feb. 14, 2017, 08 pages of ISRWO.

*Primary Examiner* — Monica D Harrison
(74) *Attorney, Agent, or Firm* — Chip Law Group (57) ABSTRACT

The present technology relates to a semiconductor integrated circuit which operates with a low voltage and is capable of preventing destruction of a protection circuit and a control method thereof. The semiconductor integrated circuit includes a resistance element and a capacitance element connected between a power supply line and a ground line in series, an inverter of which an input is connected between the resistance element and the capacitance element, a MOS transistor of which a gate electrode is connected to an output of the inverter and a drain electrode and a source electrode are respectively connected to the power supply line and the ground line, and a current limit element inserted between a well region where the MOS transistor is formed and the gate electrode. The present technology is applied to, for example, the protection circuit for preventing destruction of an internal circuit by ESD and the like.

14 Claims, 11 Drawing Sheets

RESISTANCE ELEMENT AND
PARASITIC CAPACITANCE FORM CR TIMER (51) Int. Cl.
*H01L 27/04* (2006.01)
*H01L 23/60* (2006.01)
*H01L 27/07* (2006.01)
*H01L 27/06* (2006.01)
*H03K 19/003* (2006.01)

(52) U.S. Cl.
CPC ...... *H01L 27/0277* (2013.01); *H01L 27/0285* (2013.01); *H01L 27/04* (2013.01); *H01L 27/0629* (2013.01); *H01L 27/0705* (2013.01); *H03K 19/00361* (2013.01)

(58) Field of Classification Search
CPC ... H01L 27/0285; H01L 27/06; H01L 27/062; H01L 27/0629; H01L 23/60; H01L 21/82; H01L 21/822
USPC .......................................................... 257/355
See application file for complete search history.

(56) References Cited

U.S. PATENT DOCUMENTS

| | | |
|---|---|---|
| 2010/0140712 A1 | 6/2010 | Russ |
| 2013/0057993 A1 | 3/2013 | Fukasaku |
| 2014/0339644 A1 | 11/2014 | Fukasaku |
| 2018/0024187 A1* | 1/2018 | Tatsumi ................ H01L 21/822 361/118 |

FOREIGN PATENT DOCUMENTS

| | | |
|---|---|---|
| CN | 104167416 A | 11/2014 |
| DE | 102009045793 A1 | 6/2010 |
| JP | 2006-121007 A | 5/2006 |
| JP | 2009-231312 A | 10/2009 |
| JP | 2013-055102 A | 3/2013 |
| JP | 2014-229624 A | 12/2014 |
| KR | 10-2006-0049304 A | 5/2006 |
| TW | I220312 B | 8/2004 |
| TW | I423393 B | 1/2014 |

* cited by examiner

RESISTANCE ELEMENT AND
PARASITIC CAPACITANCE FORM CR TIMER

SERIES CONNECTION
BETWEEN CAPACITANCE ELEMENT AND PARASITIC CAPACITANCE
REDUCES COMBINED CAPACITY

WHILE SERIES CONNECTION BETWEEN
CAPACITANCE ELEMENT AND PARASITIC CAPACITANCE REDUCES COMBINED CAPACITY,
CURRENT IS CONTINUOUSLY APPLIED TO WELL

SEMICONDUCTOR INTEGRATED CIRCUIT AND CONTROL METHOD THEREOF

CROSS REFERENCE TO RELATED APPLICATIONS

This application is a U.S. National Phase of International Patent Application No. PCT/JP2016/088377 filed on Dec. 22, 2016, which claims priority benefit of Japanese Patent Application No. JP 2016-000524 filed in the Japan Patent Office on Jan. 5, 2016. Each of the above-referenced applications is hereby incorporated herein by reference in its entirety.

TECHNICAL FIELD

The present technology relates to a semiconductor integrated circuit and a control method thereof, and more particularly, to a semiconductor integrated circuit which operates with a low voltage and is capable of preventing destruction of a protection circuit and a control method thereof.

BACKGROUND ART

As an Electro Static Discharge (ESD) protection circuit, an RC trigger power clamp MOS is widely used. The RC trigger power clamp MOS has a resistance element and a capacitance element connected between a power supply line and a ground line in series, a CMOS inverter of which an input is connected between the resistance element and the capacitance element, and an N-channel MOSFET as a clamp MOS. A gate of the clamp MOS is connected to an output of the CMOS inverter, and a drain and a source are respectively connected to the power supply line and the ground line.

In the RC trigger power clamp MOS, an input time delay of the CMOS inverter occurs according to a time constant of the resistance element and the capacitance element when an ESD surge current enters the RC trigger power clamp MOS, the output of the CMOS inverter becomes High, and a channel of the clamp MOS is turned ON. Then, the ESD surge current between the drain and the source can be flowed between a power supply and a ground. In a state where the ESD surge current does not enter, a voltage applied to the power supply line turns the output of the CMOS inverter to be Low and turns off the clamp MOS.

In the RC trigger power clamp MOS, the smaller a clamp voltage generated in a protection element is when the ESD surge current enters, the more a voltage applied to an internal circuit can be reduced. Therefore, a smaller clamp voltage index is desired. To reduce the clamp voltage, it is preferable to miniaturize a gate length of the MOS and increase a W size to increase a drive current of the power clamp MOS. However, to miniaturize the gate length and increase the W size cause an off-leak in a normal operation other than an ESD operation. Since the off-leak increases current consumption at the time of circuit standby, the reduction in the clamp voltage and the current consumption have a trade-off relationship.

For example, Patent Document 1 has proposed a structure in which the output of the CMOS inverter is supplied to a gate potential and a well potential of the power clamp MOS as a technology for increasing an ESD discharge capability without increasing an area. By supplying the CMOS inverter output to the well potential and increasing a substrate potential, a parasitic bipolar operation of the power clamp MOS is facilitated, and the ESD discharge capability is increased.

CITATION LIST

Patent Document

Patent Document 1: Japanese Patent Application Laid-Open No. 2006-121007

SUMMARY OF THE INVENTION

Problems to be Solved by the Invention

However, as disclosed in Patent Document 1, in a case where the output of the CMOS inverter is transmitted to the gate potential and the well potential of the power clamp MOS as a signal, it is concerned that a load of a current flowing into a PFET of the CMOS inverter through a current path of the ESD surge current is increased and that the gate potential of the power clamp MOS does not rise.

More specifically, since the CMOS inverter is formed with a size with which the power clamp MOS is driven, the CMOS inverter is not as large as the power clamp MOS. Therefore, in a case where the CMOS inverter and the power clamp MOS are connected in parallel, it is concerned that the load of the current flowing into the PFET of the CMOS inverter through the current path of the ESD surge current is increased and the PFET of the CMOS inverter is destroyed first by ESD.

Furthermore, when the well and the source of the power clamp MOS are connected, since a forward-direction diode is formed between the well and the source, the voltage is fixed to a diode voltage. This may be a reason why the gate potential of the power clamp MOS does not rise. If the gate potential does not rise, a channel current does not sufficiently flow. Accordingly, a discharge capability is lowered.

The present technology has been made in view of such a situation. A purpose of the present technology is to operate with a low voltage and prevent destruction of a protection circuit.

Solutions to Problems

A semiconductor integrated circuit according to one aspect of the present technology includes a resistance element and a capacitance element connected between a power supply line and a ground line in series, an inverter of which an input is connected between the resistance element and the capacitance element, a MOS transistor of which a gate electrode is connected to an output of the inverter and a drain electrode and a source electrode are respectively connected to the power supply line and the ground line, and a current limit element inserted between a well region where the MOS transistor is formed and the gate electrode.

In a control method of a semiconductor integrated circuit according to one aspect of the present technology, a current limit element including the semiconductor integrated circuit, which includes a resistance element and a capacitance element connected between a power supply line and a ground line in series, an inverter of which an input is connected between the resistance element and the capacitance element, a MOS transistor of which a gate electrode is connected to an output of the inverter and a drain electrode and a source electrode are respectively connected to the power supply line and the ground line, and a current limit element inserted between a well region where the MOS transistor is formed and the gate electrode, limits a current flowing into the inverter and increases a potential in the well region to accelerate an ON operation of the MOS transistor.

In one aspect of the present technology, in the current limit element of the semiconductor integrated circuit including a resistance element and a capacitance element connected between a power supply line and a ground line in series, an inverter of which an input is connected between the resistance element and the capacitance element, a MOS transistor of which a gate electrode is connected to an output of the inverter and a drain electrode and a source electrode are respectively connected to the power supply line and the ground line, and the current limit element inserted between a well region where the MOS transistor is formed and the gate electrode, a current flowing into the inverter is limited and a potential in the well region is increased to accelerate an ON operation of the MOS transistor.

Furthermore, the semiconductor integrated circuit may be an independent device or may be an inner block forming a single device.

Effects of the Invention

According to one aspect of the present technology, it is possible to operate with a low voltage and prevent destruction of a protection circuit.

Note that the effects described herein are not necessarily limited and that the effect may be any effects described in the present disclosure.

MODE FOR CARRYING OUT THE INVENTION

An embodiment for carrying out the present technology (referred to as an embodiment below) will be described below. Note that, the description will be made in the following order.

1. First Embodiment of the ESD Protection Circuit (configuration example in which a current limit element is a resistance element)
2. Second Embodiment of the ESD Protection Circuit (configuration example in which a current limit element is a capacitance element)
3. Third Embodiment of the ESD Protection Circuit (configuration example in which a current limit element is a resistance element and a capacitance element)
4. Structural Examples according to the First to Third Embodiments 1. First Embodiment of ESD Protection Circuit FIG. 1 is a circuit diagram of a first embodiment of an ESD protection circuit.

Figure 1:
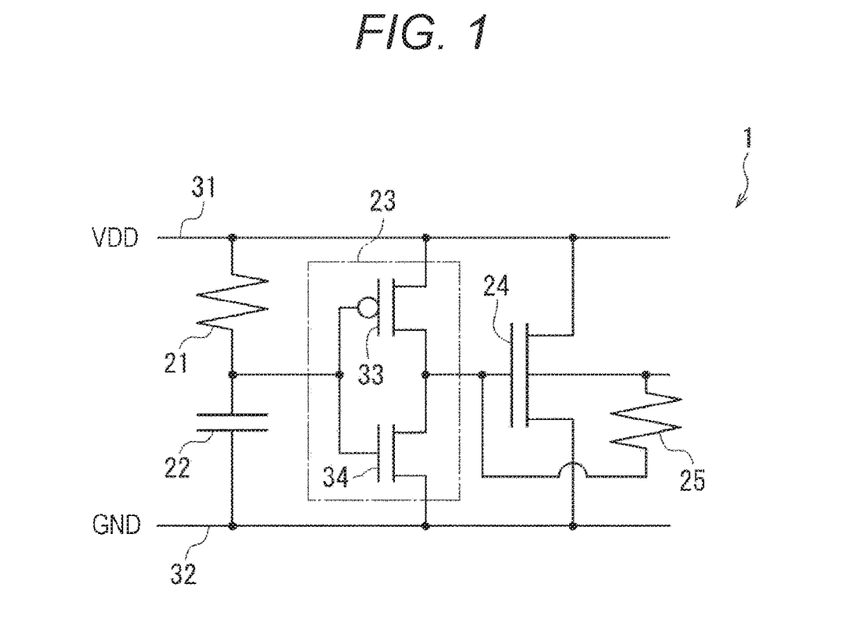
FIG. 1 is a circuit diagram of a first embodiment of an ESD protection circuit.

An ESD protection circuit 1 illustrated in FIG. 1 is a semiconductor integrated circuit which prevents destruction of an internal circuit (not shown) caused by Electro Static Discharge (ESD). The ESD protection circuit 1 includes a resistance element 21, a capacitance element 22, a CMOS inverter 23, a power clamp MOS 24, and a resistance element 25 and is referred to as an RC trigger power clamp MOS.

The resistance element 21 and the capacitance element 22 are connected in series and are inserted between a power supply line 31 and a ground line 32. The CMOS inverter 23 includes a P-channel MOSFET (referred to as PFET below) 33 and an N-channel MOSFET (referred to as NFET below) 34. A connection point between the resistance element 21 and the capacitance element 22 is an input, and an output is connected to a gate electrode of the power clamp MOS 24. Furthermore, the output of the CMOS inverter 23 is also connected to a well region where the power clamp MOS 24 is formed via the resistance element 25. A drain electrode of the power clamp MOS 24 is connected to the power supply line 31, and a source electrode is connected to the ground line 32. Note that, in the following description, to simplify the description, the gate electrode, the source electrode, the drain electrode, and the well region are simply and respectively referred to as a gate, a source, a drain, and a well.

The resistance element 21 of the RC trigger includes, for example, a poly resistor using a polysilicon gate electrode or a resistance element such as a MOSFET. A resistance value of the resistance element 21 is set to, for example, several M$\Omega$ or the like, and can be adjusted according to the size of the element. The capacitance element 22 of the RC trigger includes, for example, MOS capacitors or parallel flat plates between wiring layers. A capacitance value of the capacitance element 22 is adjusted to, for example, several pF or the like, according to the size of the element. Since a reference time to flow an ESD surge current can be found by a model assumed as the ESD surge current, for example, in a case where a Human Body Model (HBM) is expected, an RC time constant is adjusted with a reference of about one μsec or the like, and a resistance value of the resistance element 21 and a capacitance value of the capacitance element 22 are designed. For example, if the resistance element 21 of one M$\Omega$ and the capacitance element 22 of one pF are used for an RC time constant, a time in which the ESD surge current is flowed is set to R×C=1M ($\Omega$)×1p (F)=1µ (sec). On the other hand, the resistance element 25 inserted between the gate and the well of the power clamp MOS 24 has a resistance value set to about several thousand Ω using, for example, the polysilicon gate electrode.

Figure 2:
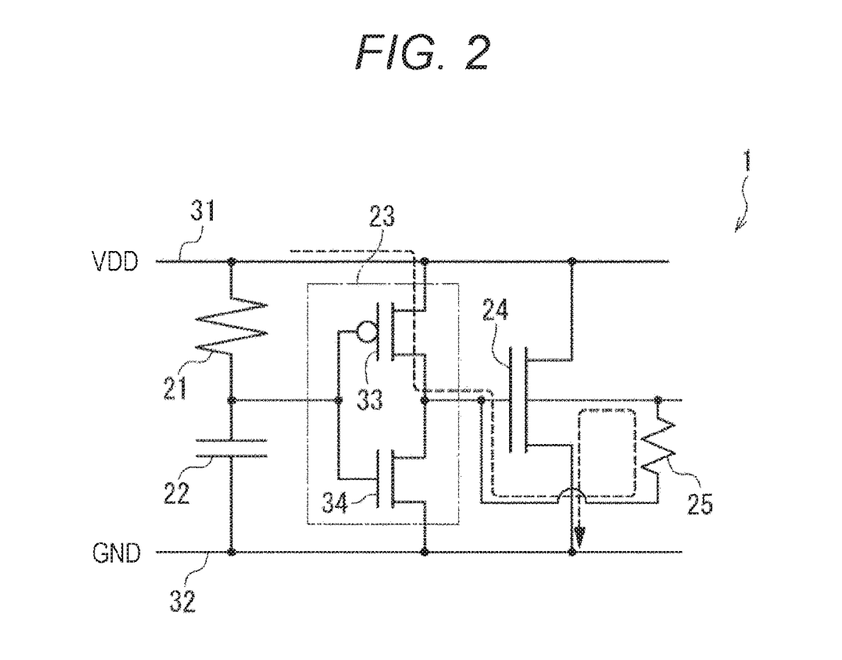
FIG. 2 is a diagram to describe a path of an ESD surge current.

In a state before the power clamp MOS 24 is turned on and the ESD surge current flows by a channel current, the ESD surge current flows along a path indicated by a broken line in FIG. 2. Since the CMOS inverter 23 is formed with a size with which the power clamp MOS 24 is driven, the CMOS inverter 23 is not as large as the power clamp MOS 24. Therefore, there is a concern that the PFET 33 of the CMOS inverter 23, which is a driving circuit of the power clamp MOS 24, is firstly destroyed by ESD.

However, according to the ESD protection circuit 1 of the first embodiment, by inserting the resistance element 25 between the gate and the well of the power clamp MOS 24, a current flowing into the PFET 33 of the CMOS inverter 23 is reduced. Therefore, it is possible to prevent the PFET 33 of the CMOS inverter 23 from being firstly destroyed by the ESD.

Furthermore, by inserting the resistance element 25 between the gate and the well of the power clamp MOS 24, a gate potential of the power clamp MOS is increased, and a channel can be formed.

Figure 3:
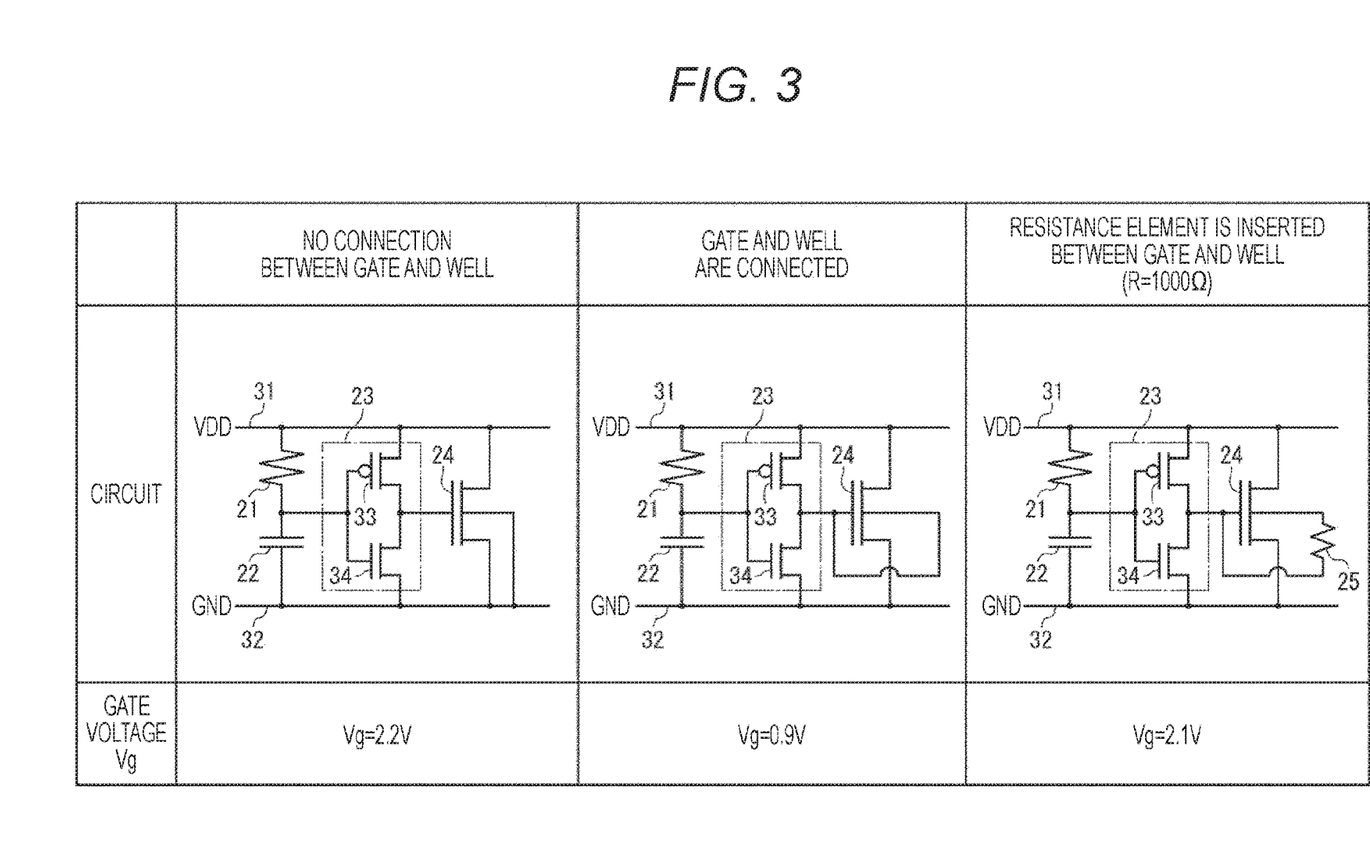
FIG. 3 is a diagram of a result of examination on an effect caused by inserting a resistance element.

FIG. 3 is a diagram of a result of examination on an effect caused by inserting the resistance element 25 between the gate and the well of the power clamp MOS 24.

As illustrated on the left of FIG. 3, in a case where the gate and the well of the power clamp MOS 24 are not connected, a gate voltage Vg is about 2.2 V.

As illustrated at the center of FIG. 3, when the gate and the well of the power clamp MOS 24 are directly connected to each other, a forward-direction diode path is formed in a direction from the well to the source, the gate voltage Vg is clamped by a diode voltage. Therefore, the gate voltage Vg is fixed to about 0.9 V.

On the other hand, as illustrated on the right of FIG. 3, if the configuration of the ESD protection circuit 1 according to the first embodiment is employed and the gate and the well are connected by inserting the resistance element 25 of, for example, 1000Ω between the gate and the well, a potential difference between the gate and the well occurs, and the gate voltage Vg is increased to 2.1 V which is almost the same as that in an original state where the gate and the well are not connected.

As described above, since the potential difference between the gate and the well occurs by inserting the resistance element 25 between the gate and the well of the power clamp MOS 24, an effect can be obtained such that the gate potential of the power clamp MOS is increased and the channel is formed.

Figure 4A:
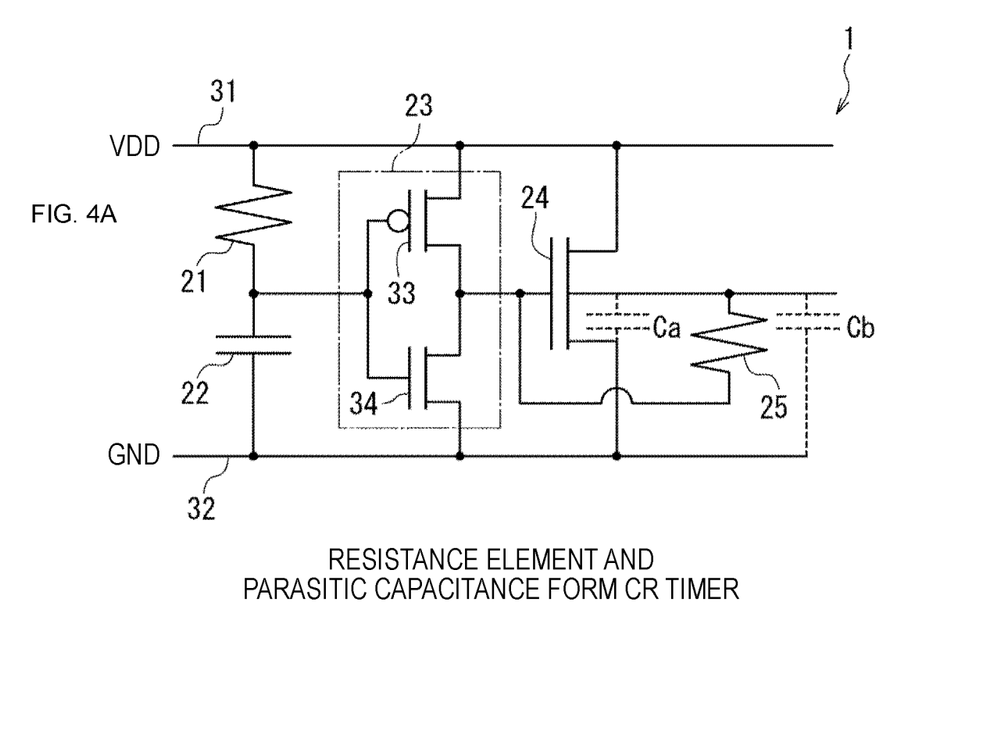
FIGS. 4A and 4B are diagrams to describe an ESD response characteristic of a well of a power clamp MOS according to the first embodiment.
Figure 4B:
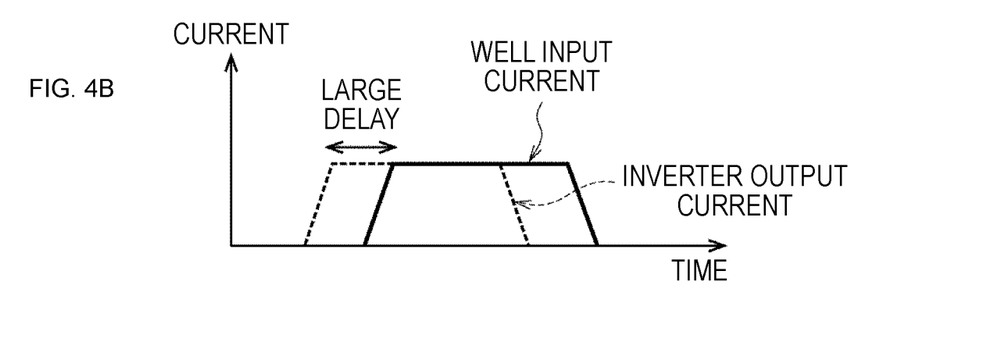

FIGS. 4A and 4B are diagrams to describe an ESD response characteristic of the well of the power clamp MOS 24 according to the first embodiment.

According to the first embodiment, since a parasitic capacitance Ca between the source and the well of the power clamp MOS 24 indicated by a broken line in FIG. 4A, a parasitic capacitance Cb between the well and a substrate, and the resistance element 25 form a CR timer, as illustrated in FIG. 4B, the current input to the well of the power clamp MOS 24 increases with a certain delay from the output current of the CMOS inverter 23.

A current is supplied to the well of the power clamp MOS 24, and a potential of the well rises. As a result, an operation start voltage of the power clamp MOS 24 is lowered by a substrate bias effect, and a voltage at the time of starting the ESD operation can be lowered. Therefore, a low voltage protection can be achieved. In addition, the increase in the potential of the well facilitates an ON operation of a parasitic bipolar transistor, and the ON operation of the parasitic bipolar transistor and the channel operation of the power clamp MOS 24 can accelerate an operation of supplying a high voltage to the ground line 32 (clamp operation).

In addition, by simultaneously supplying the output of the CMOS inverter 23 to the gate and the well of the power clamp MOS 24, it is not necessary to increase a circuit area than a case where inverters are separately prepared for the gate and the well.

2. Second Embodiment of ESD Protection Circuit

Figure 5:
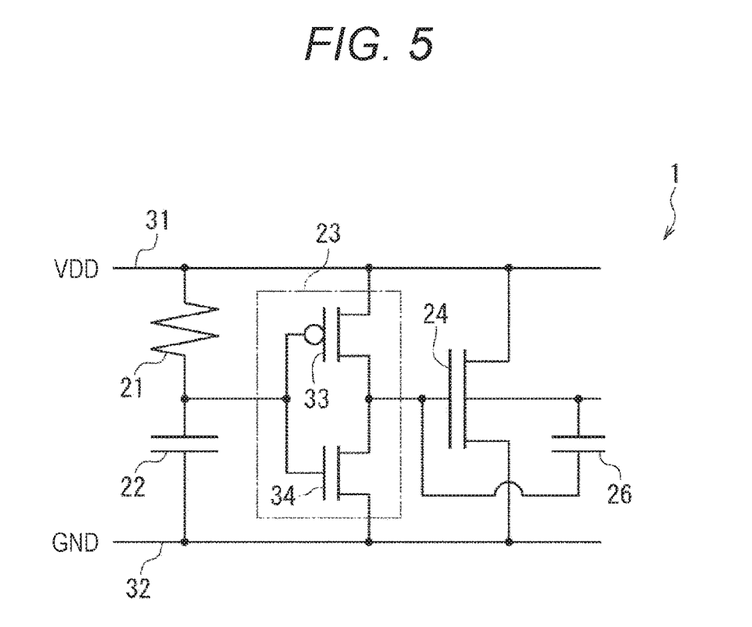
FIG. 5 is a circuit diagram of a second embodiment of an ESD protection circuit.

FIG. 5 is a circuit diagram of a second embodiment of an ESD protection circuit.

Note that, in FIG. 5, components common to those in the first embodiment illustrated in FIG. 1 are denoted with the same reference numerals, and description thereof will be omitted.

The second embodiment is different from the first embodiment in that the resistance element 25 inserted between the gate and the well of the power clamp MOS 24 in the first embodiment is replaced with a capacitance element 26. The capacitance element 26 can include, for example, a MOS capacitor. If the capacitance element 26 is formed to have a capacitance value of about 0.01 pF, a response can be made with a rise time of an ESD surge of about 10 nsec.

Figure 6A:
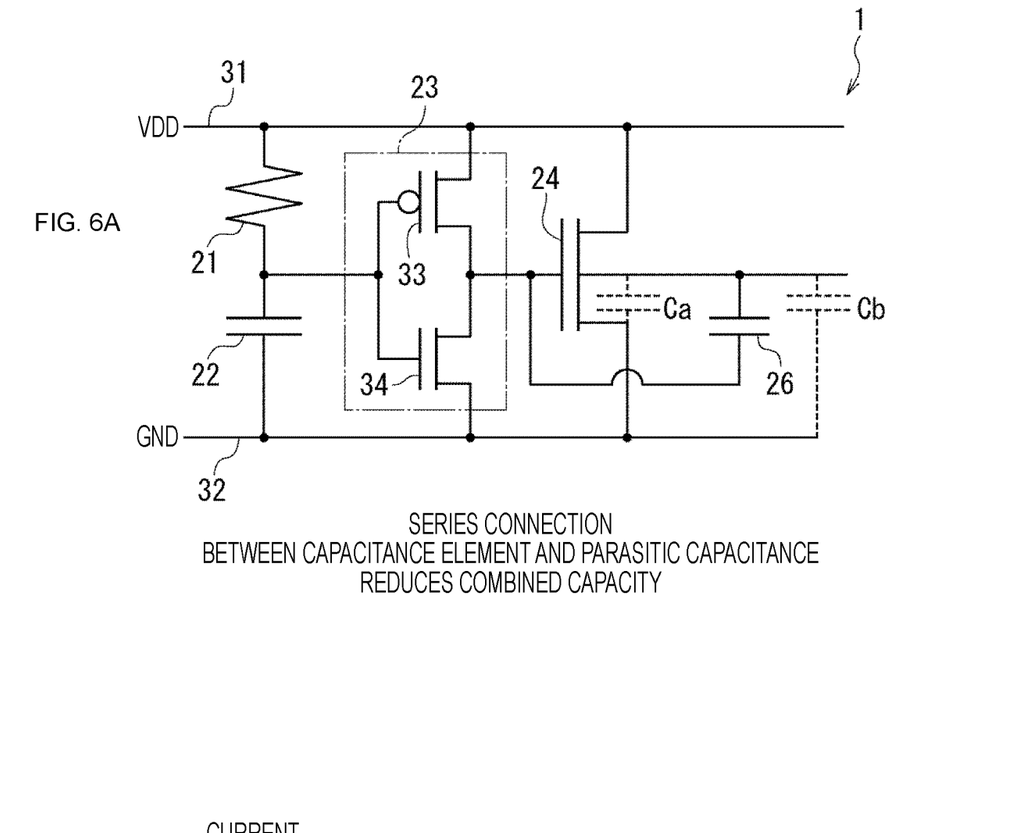
FIGS. 6A and 6B are diagrams to describe an ESD response characteristic of a well of a power clamp MOS according to the second embodiment.
Figure 6B:
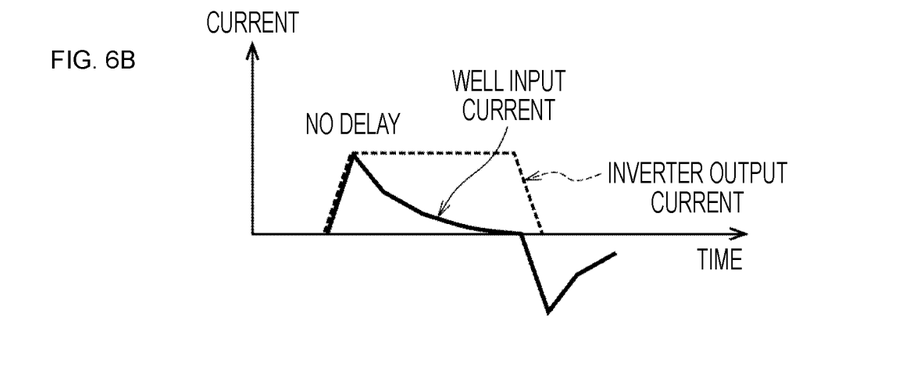

FIGS. 6A and 6B are diagrams to describe an ESD response characteristic of the well of the power clamp MOS 24 according to the second embodiment.

According to the second embodiment, as illustrated in FIG. 6A, a combined capacity is reduced by connecting a parasitic capacitance Ca between a source and a well of the power clamp MOS 24, a parasitic capacitance Cb between the well and a substrate, and the capacitance element 26 in series. As a result, as illustrated in FIG. 4B, an output current of a CMOS inverter 23 is instantaneously input to the well of the power clamp MOS 24, only when the ESD surge current enters, without a delay, and a potential of the well rises. As a result, since a current path, indicated by a broken line in FIG. 2, via the CMOS inverter 23 is instantaneously generated, a current flowing into a PFET 33 of the CMOS inverter 23 is reduced, and ESD destruction on the PFET 33 of the CMOS inverter 23 can be prevented.

In other words, in the first embodiment, the thermal destruction of the PFET 33 due to a current concentration of the ESD surge current is prevented by limiting the current. Whereas, in the second embodiment, the thermal destruction of the PFET 33 is prevented by limiting a current-flowing time in terms of time.

In addition, by raising the potential of the well early, the parasitic bipolar transistor can be quickly turned on. Therefore, a speed-up effect can be expected. After the ON operation, the parasitic bipolar transistor continuously performs self-operation. Therefore, it is sufficient to supply a current at the beginning.

3. Third Embodiment of ESD Protection Circuit

Figure 7:
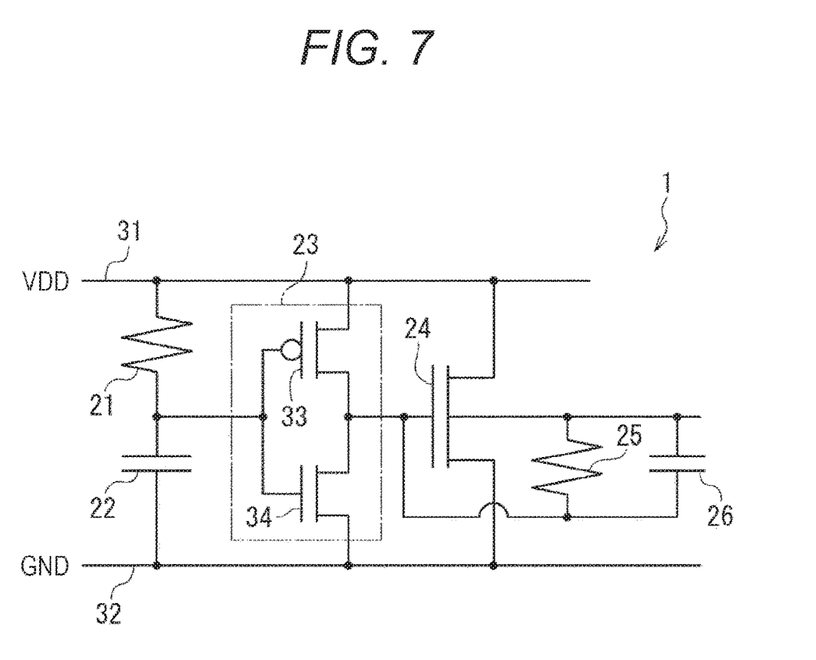
FIG. 7 is a circuit diagram of a third embodiment of an ESD protection circuit.

FIG. 7 is a circuit diagram of a third embodiment of an ESD protection circuit.

Note that, in FIG. 7, components common to those in the first embodiment and the second embodiment are denoted with the same reference numerals, and description thereof will be omitted.

In the third embodiment, both of the resistance element 25 in the first embodiment and the capacitance element 26 in the second embodiment are inserted between the gate and the well of the power clamp MOS 24 in parallel.

Figure 8A:
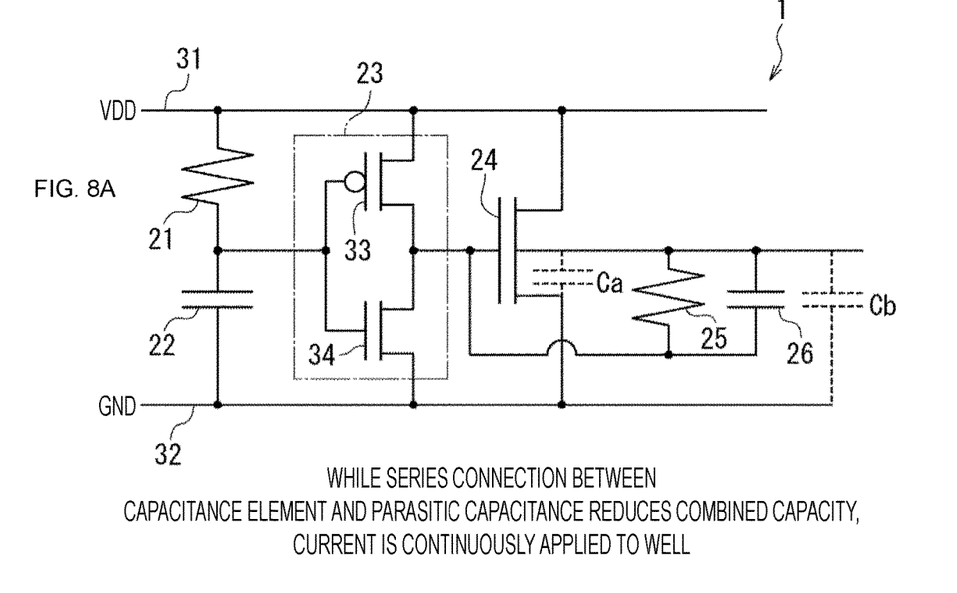
FIGS. 8A and 8B are diagrams to describe an ESD response characteristic of a well of a power clamp MOS according to the third embodiment.
Figure 8B:
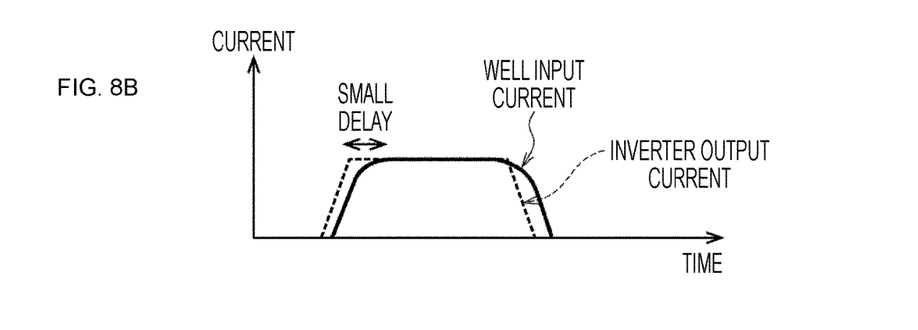

FIGS. 8A and 8B are diagrams to describe an ESD response characteristic of the well of the power clamp MOS 24 according to the third embodiment.

By inserting both of the resistance element 25 and the capacitance element 26 between the gate and the well of the power clamp MOS 24 in parallel, while a combined capacity is reduced by connection between a parasitic capacitance Ca between the source and the well of the power clamp MOS 24 and a parasitic capacitance Cb between the well and the substrate and the capacitance element 26 in series, a current continuously flows via the resistance element 25. A delay of a well input current of the power clamp MOS 24 with respect to an output current of the CMOS inverter 23 is smaller than that in a case where only the resistance element 25 is provided.

According to the third embodiment, the features of both the first embodiment and the second embodiment described above are combined. Therefore, it is possible to reduce the current flowing into a PFET 33 of the CMOS inverter 23 and to prevent ESD destruction on the PFET 33 of the CMOS inverter 23. Furthermore, as raising a well potential early, an operation start voltage of the power clamp MOS 24 is lowered by a substrate bias effect, and a voltage at the time of starting the ESD operation can be lowered. Therefore, a low voltage protection can be achieved.

4. Structural Examples According to the First to Third Embodiments

Next, the structures of the power clamp MOS 24, the resistance element 25, and the capacitance element 26 for realizing the first to third embodiments will be described.

4.1 First Structural Example According to the First Embodiment

Figure 9A:
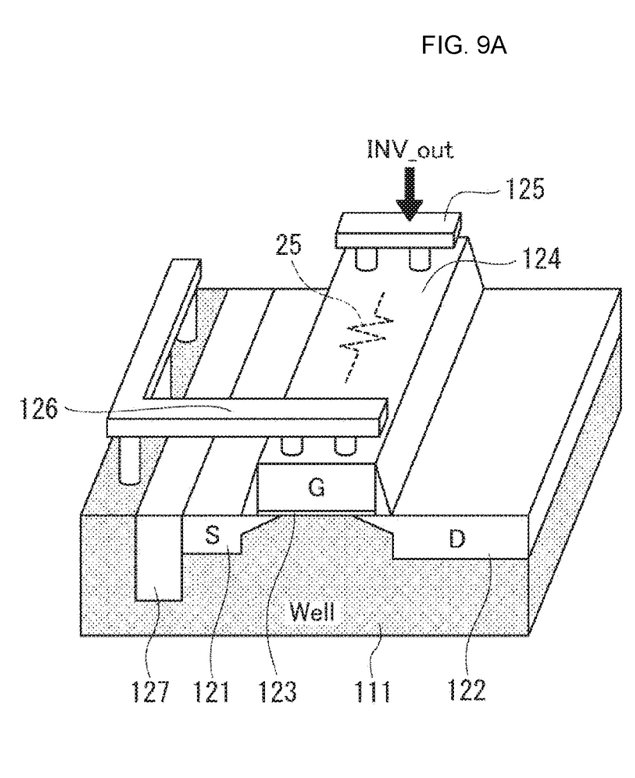
FIGS. 9A and 9B are diagrams of a first structural example according to the first embodiment of the ESD protection circuit.
Figure 9B:
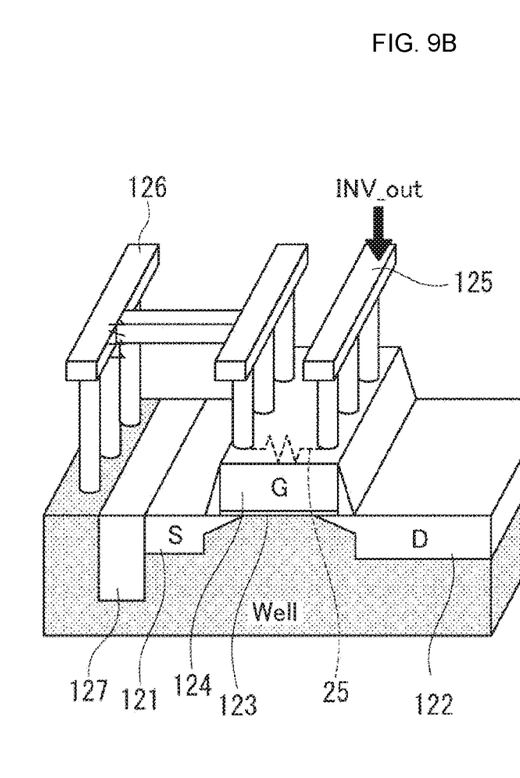

FIGS. 9A and 9B are diagrams of a first structural example of the power clamp MOS 24 and the resistance element 25 according to the first embodiment of the ESD protection circuit 1 illustrated in FIG. 1.

As illustrated in FIGS. 9A and 9B, in a well region 111 of a semiconductor substrate, a source region 121 and a drain region 122 of the power clamp MOS 24 are formed. The well region 111 includes a P-type impurity region, and the source region 121 and the drain region 122 include N-type impurity regions.

On the substrate between the source region 121 and the drain region 122 of the power clamp MOS 24, a gate electrode 124 of the power clamp MOS 24 is formed via a gate insulation film 123. The gate insulation film 123 includes, for example, an oxide film, and the gate electrode 124 includes, for example, polysilicon.

Two contact portions 125 and 126 are formed on an upper portion of the gate electrode 124 having a rectangular planar region, and the one contact portion 125 is connected to the output of the CMOS inverter 23. The other contact portion 126 is connected to the well region 111. An insulation layer 127 is formed between the well region 111 to which the contact portion 126 is connected and the source region 121. The contact portions 125 and 126 include metal wires of Cu, Al, for example.

In FIG. 9A, a structure is illustrated in which the contact portion 125 connected to the output of the CMOS inverter 23 and the contact portion 126 connected to the well region 111 are arranged at both ends along the longitudinal direction of the gate electrode 124 having a rectangular planar region. In FIG. 9B, a structure is illustrated in which the contact portions 125 and 126 are arranged at both ends along the short-side direction of the gate electrode 124.

With the above structure, the output current of the CMOS inverter 23 input from the contact portion 125 flows from one end to the other end of the gate electrode 124 and reaches the contact portion 126, and then, is supplied from the contact portion 126 to the well region 111. Therefore, (a resistance component of) the gate electrode 124 of the power clamp MOS 24 functions as the resistance element 25 inserted between the gate and the well of the power clamp MOS 24. In a case where the contact portions 125 and 126 are arranged along the longitudinal direction as illustrated in FIG. 9A, a sheet resistance of, for example, about several Ω can be realized. In a case where the contact portions 125 and 126 are arranged along the short-side direction as illustrated in FIG. 9B, a sheet resistance of, for example, about one Ω can be realized.

4.2 Second Structural Example According to the First Embodiment

Figure 10:
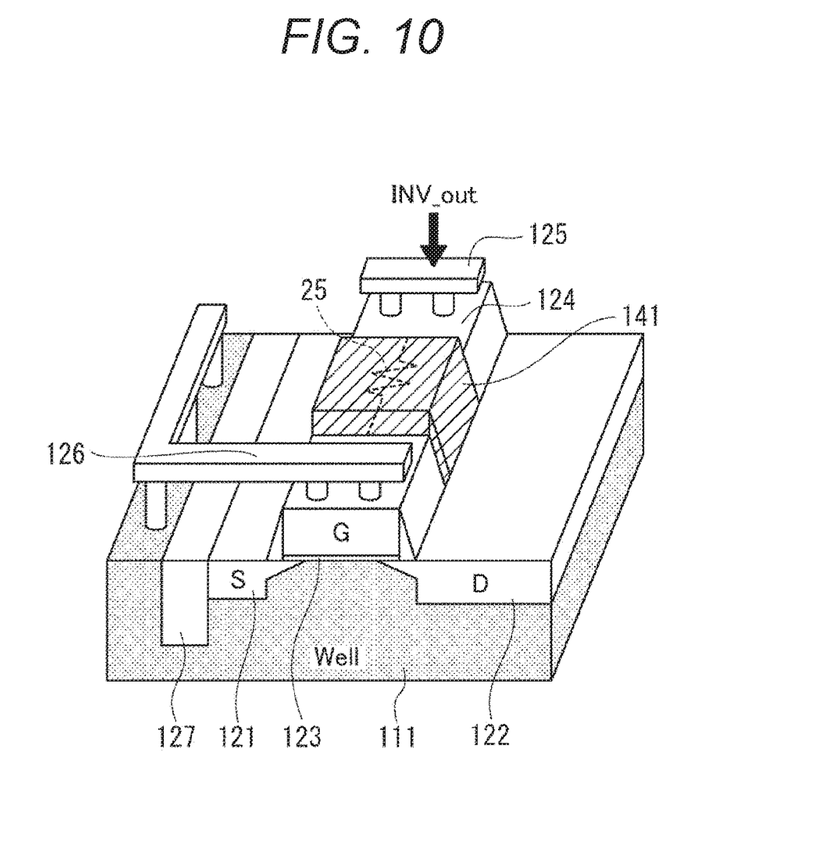
FIG. 10 is a diagram of a second structural example according to the first embodiment of the ESD protection circuit.

FIG. 10 is a diagram of a second structural example of the power clamp MOS 24 and the resistance element 25 according to the first embodiment of the ESD protection circuit 1 illustrated in FIG. 1.

In the second structural example in FIG. 10, a high-resistance resistance element 25 is formed by further providing a silicide block 141 on the gate electrode 124 of the power clamp MOS 24 of the first structural example illustrated in FIG. 9A. By providing the silicide block 141, a sheet resistance of about several dozen Ω can be realized. In comparison with the structure illustrated in FIG. 9A in which the silicide block 141 is not provided, a sheet resistance of about ten times can be realized.

Note that although not shown, in the structure in which the contact portions 125 and 126 are arranged along the short-side direction as illustrated in FIG. 9B, the silicide block 141 can be further provided on the gate electrode 124.

4.3 Third Structural Example According to the First Embodiment

Figure 11A:
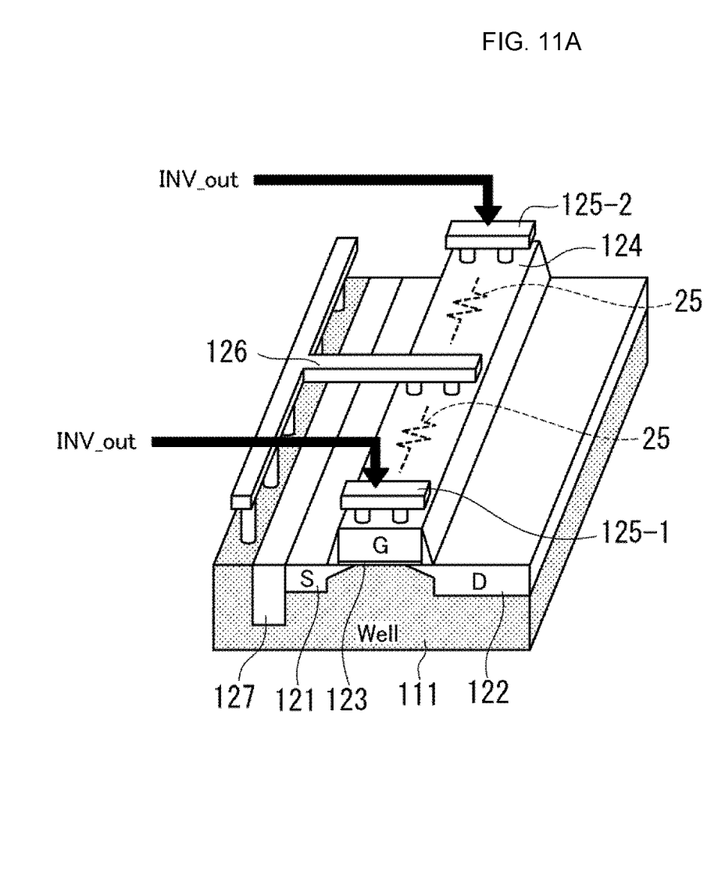
FIGS. 11A and 11B are diagrams of a third structural example according to the first embodiment of the ESD protection circuit.
Figure 11B:
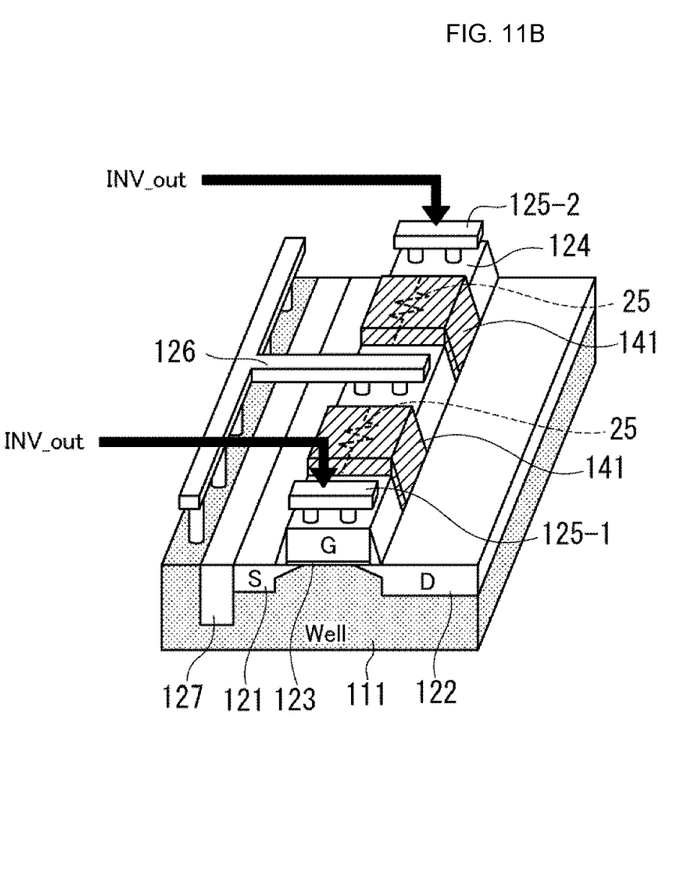

FIGS. 11A and 11B are diagrams of a third structural example of the power clamp MOS 24 and the resistance element 25 according to the first embodiment of the ESD protection circuit 1 illustrated in FIG. 1.

In the first and second structural examples, one end (contact portion 125) of the gate electrode 124 having a rectangular planar region is a current input unit, and the other end (contact portion 126) is a current output unit. Therefore, the current becomes uneven in the surface of the gate electrode 124.

Therefore, in the third structural example, as illustrated in FIGS. 11A and 11B, two contact portions 125-1 and 125-2 are formed at both ends of the gate electrode 124 having a rectangular planar region, and an output of the CMOS inverter 23 is supplied via the two contact portions 125-1 and 125-2. Furthermore, another contact portion 126 is formed near the center of the gate electrode 124 which is an intermediate portion between the contact portions 125-1 and 125-2, and the gate electrode 124 and the well region 111 are connected to each other via the contact portion 126. With this structure, it is possible to facilitate a snapback operation in the end portion of the gate electrode 124 where the snapback operation is unlikely to occur, and unevenness of the current in the surface of the gate electrode 124 can be prevented.

FIG. 11A illustrates an example in which the contact portions 125-1 and 125-2 and the contact portion 126 are formed so as to improve unevenness of the current in the surface of the gate electrode 124 regarding the structure in which (the resistance component of) the gate electrode 124 of the power clamp MOS 24 is used as the resistance element 25 illustrated in FIG. 9A.

FIG. 11B illustrates an example in which the contact portions 125-1 and 125-2 and the contact portion 126 are formed so as to improve unevenness of the current in the surface of the gate electrode 124 regarding the structure in which the silicide blocks 141 are formed on the gate electrode 124 of the power clamp MOS 24 and used as the resistance element 25 illustrated in FIG. 10. In this example, the silicide blocks 141 are arranged between the contact portion 125-1 and the contact portion 126 and between the contact portion 125-2 and the contact portion 126.

4.4 Structural Example According to the Second Embodiment

Figure 12:
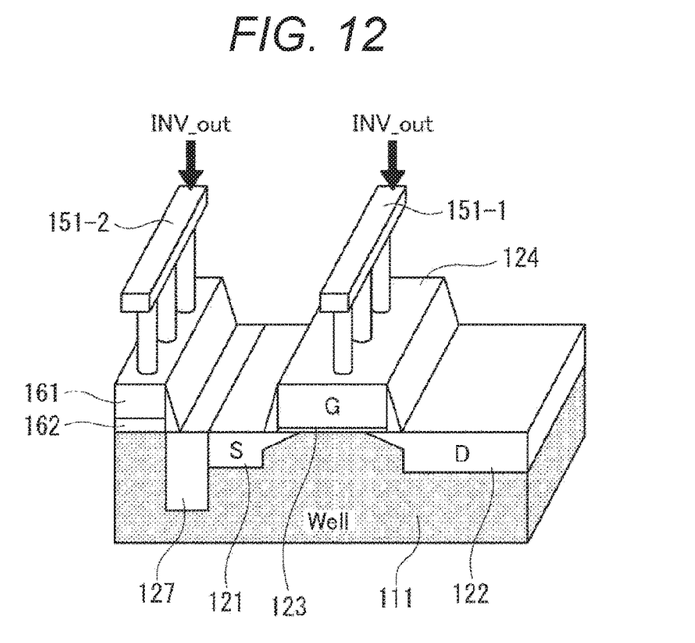
FIG. 12 is a diagram of a structural example according to the second embodiment of the ESD protection circuit.

FIG. 12 is a diagram of a structural example of the power clamp MOS 24 and the capacitance element 26 according to the second embodiment of the ESD protection circuit 1 illustrated in FIG. 5.

In the structural example in FIG. 12, the structure of the power clamp MOS 24 is similar to those of the first to third structural examples according to the first embodiment. That is, the source region 121 and the drain region 122 of the power clamp MOS 24 are formed in the well region 111 of the semiconductor substrate, and the gate electrode 124 of the power clamp MOS 24 is formed on the substrate between the source region 121 and the drain region 122 via the gate insulation film 123.

Then, in the structural example in FIG. 12, a gate electrode 161 and a gate insulation film 162 forming a MOS capacitor as the capacitance element 26 included in the second embodiment of the ESD protection circuit 1 are formed on the opposite side of the power clamp MOS 24 with an insulation layer 127 provided therebetween. The gate electrode 161 and the gate insulation film 162 forming the MOS capacitor together with the well region 111 can be simultaneously formed by using the same material and the same manufacturing method as those of the gate electrode 124 and the gate insulation film 123 of the power clamp MOS 24.

A contact portion 151-1 connected to the output of the CMOS inverter 23 is formed on the upper surface of the gate electrode 124 of the power clamp MOS 24, and a contact portion 151-2 connected to the output of the CMOS inverter 23 is formed on the upper surface of the gate electrode 161 of the capacitance element 26.

With the above structure, a circuit including the power clamp MOS 24 and the capacitance element 26 according to the second embodiment of the ESD protection circuit 1 illustrated in FIG. 5 can be realized. By forming the gate electrode 161 of the capacitance element 26 to have an area equal to the area of the gate electrode 124 of the power clamp MOS 24, a rise time of a response can be shortened by about half.

4.5 Structural Example According to the Third Embodiment

Figure 13:
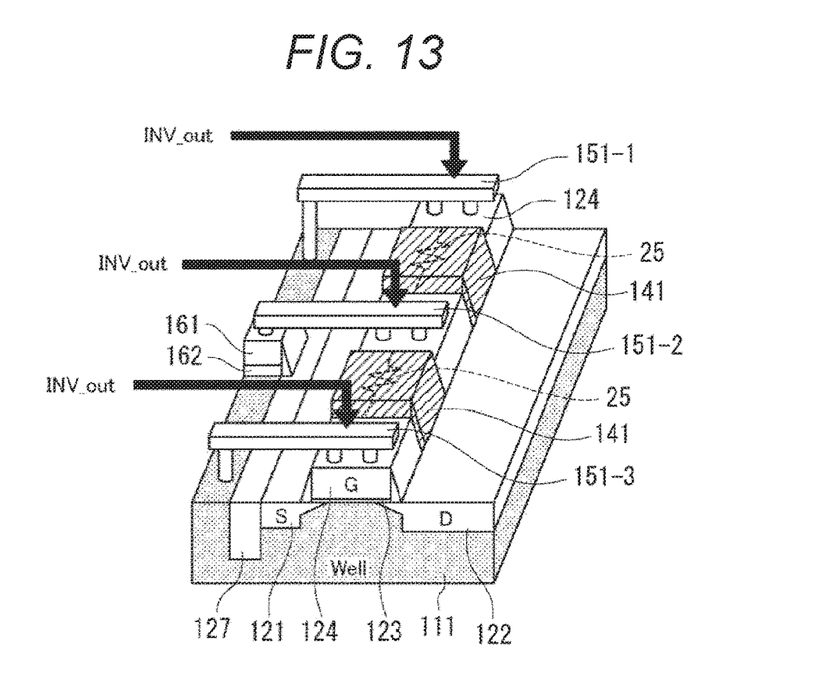
FIG. 13 is a diagram of a structural example according to the third embodiment of the ESD protection circuit.

FIG. 13 is a diagram of a structural example of the power clamp MOS 24, the resistance element 25, and the capacitance element 26 according to the third embodiment of the ESD protection circuit 1 illustrated in FIG. 7.

The structural example in FIG. 13 is a combination of the third structural example according to the first embodiment illustrated in FIG. 11B and the structural example according to the second embodiment illustrated in FIG. 12. That is, in the structural example in FIG. 13, the power clamp MOS 24 and the resistance element 25 are formed similarly to the third structural example according to the first embodiment forming the resistance element 25 by the silicide block 141, and the capacitance element 26 is formed similarly to the structural example according to the second embodiment including the MOS capacitor.

Three contact portions 151-1 to 151-3 connected to the output of the CMOS inverter 23 are formed on the upper surface of the gate electrode 124 of the power clamp MOS 24 and arranged at both ends and near the center of the gate electrode 124. More specifically, the contact portions 151-1 and 151-3 are respectively formed at one end and the other end of the gate electrode 124 in the longitudinal direction, and the contact portion 151-2 is formed near the center of the gate electrode 124 in the longitudinal direction. In addition, the contact portion 151-2 is connected to the gate electrode 161 forming the MOS capacitor as the capacitance element 26.

With the above structure, a circuit including the power clamp MOS 24, the resistance element 25, and the capacitance element 26 according to the third embodiment of the ESD protection circuit 1 illustrated in FIG. 7 can be realized.

Note that, in the structural example in FIG. 13, as the configuration of the resistance element 25, a configuration in which the silicide block 141 is provided on the gate electrode 124 of the power clamp MOS 24 is employed similarly to FIG. 11B. However, a configuration in which only the gate electrode 124 of the power clamp MOS 24 is used as the resistance element 25 similarly to the configuration in FIG. 11A may be used.

SUMMARY

As described above, the ESD protection circuit 1 includes the resistance element 21 and the capacitance element 22 connected between the power supply line 31 and the ground line 32 in series, the CMOS inverter 23 of which the input is connected between the resistance element 21 and the capacitance element 22, the power clamp MOS (MOS transistor) 24 of which the gate electrode is connected to the output of the CMOS inverter 23 and the drain electrode and the source electrode are respectively connected to the power supply line 31 and the ground line 32, and the current limit element which is inserted between the well region where the power clamp MOS 24 is formed and the gate electrode. The current limit element includes one of or both of the resistance element 25 and the capacitance element 26.

By limiting the current flowing into the CMOS inverter 23 and increasing the potential of the well region by the current limit element, the ON operation of the power clamp MOS 24 is accelerated. Therefore, the ESD protection circuit 1 can operate with a low voltage and prevent destruction of the protection circuit.

Here, the resistance element 25 or the capacitance element 26 functions as a current limit element which prevents thermal destruction of the PFET 33 due to a current concentration of the ESD surge current by limiting the current. The resistance element 25 limits an amount of the current, and the capacitance element 26 limits a current flowing time.

In a case where the resistance element 25 is included as the current limit element, by applying a potential to the well region of the power clamp MOS 24, the operation start voltage of the power clamp MOS 24 is lowered by the substrate bias effect, and the voltage at the time of starting the ESD operation can be lowered. In addition, an increase in the well potential can facilitate a parasitic bipolar operation and increases an ESD discharge capability. The existence of the resistance element 25 reduces the current flowing into the CMOS inverter 23 and prevents destruction of the CMOS inverter 23 before the destruction of the power clamp MOS 24. A difference between the gate electrode of the power clamp MOS 24 and the well potential occurs, and the gate voltage Vg is increased, and the channel of the power clamp MOS 24 is formed. Accordingly, the ESD surge current can flow.

In a case where the capacitance element 26 is included as the current limit element, when the ESD surge is generated, the capacitance element 26 instantaneously raises a substrate potential. A continuous flow of the current into the CMOS inverter 23 can be prevented. Since the speed-up effect can be obtained, a protection operation start time can be shortened. Therefore, the application of the voltage to the internal circuit can be prevented.

The embodiment of the present technology is not limited to the above-mentioned embodiments, and various changes can be made without departing from the scope of the present technology.

Note that the effects described herein are only exemplary and not limited to these. There may be an additional effect other than those described herein.

Note that, the present technology can have the configuration below.

(1) A semiconductor integrated circuit including:
a resistance element and a capacitance element connected between a power supply line and a ground line in series;
an inverter of which an input is connected between the resistance element and the capacitance element;
a MOS transistor of which a gate electrode is connected to an output of the inverter and a drain electrode and a source electrode are respectively connected to the power supply line and the ground line; and
a current limit element inserted between a well region where the MOS transistor is formed and the gate electrode.

(2) The semiconductor integrated circuit according to (1), in which
the current limit element includes a resistance element.

(3) The semiconductor integrated circuit according to (2), in which
the resistance element as the current limit element is configured by the gate electrode of the MOS transistor.

(4) The semiconductor integrated circuit according to (2) or (3), in which
the resistance element as the current limit element includes a silicide block formed on the gate electrode of the MOS transistor.

(5) The semiconductor integrated circuit according to any one of (2) to (4), in which
the output of the inverter is connected to two contact portions at both ends of the gate electrode of the MOS transistor, and the well region is connected to a contact portion near a center of the gate electrode of the MOS transistor.

(6) The semiconductor integrated circuit according to (1), in which
the current limit element includes a capacitance element.

(7) The semiconductor integrated circuit according to (6), in which
the capacitance element as the current limit element is configured by a MOS capacitor.

(8) The semiconductor integrated circuit according to (1), in which
the current limit element includes a resistance element and a capacitance element.

(9) The semiconductor integrated circuit according to (8), in which
the current limit element includes a resistance element and a capacitance element connected in parallel.

(10) The semiconductor integrated circuit according to (8) or (9), in which
the resistance element as the current limit element is configured by the gate electrode of the MOS transistor.

(11) The semiconductor integrated circuit according to any one of (8) to (10), in which
the resistance element as the current limit element includes a silicide block formed on the gate electrode of the MOS transistor.

(12) The semiconductor integrated circuit according to any one of (8) to (11), in which
the capacitance element as the current limit element is configured by a MOS capacitor.

(13) The semiconductor integrated circuit according to any one of (8) to (12), in which
the output of the inverter is connected to three contact portions provided at both ends and near a center of the gate electrode of the MOS transistor, the contact portions at the both ends of the gate electrode are directly connected to the well region, and the contact portion near the center of the gate electrode is connected to the well region via the capacitance element as the current limit element.

(14) A control method of a semiconductor integrated circuit, in which
the semiconductor integrated circuit includes:
a resistance element and a capacitance element connected between a power supply line and a ground line in series;
an inverter of which an input is connected between the resistance element and the capacitance element;
a MOS transistor of which a gate electrode is connected to an output of the inverter and a drain electrode and a source electrode are respectively connected to the power supply line and the ground line; and
a current limit element inserted between a well region where the MOS transistor is formed and the gate electrode, and
the current limit element limits a current flowing into the inverter and increases a potential in the well region to accelerate an ON operation of the MOS transistor.

REFERENCE SIGNS LIST

1 ESD protection circuit
21 resistance element
22 capacitance element
23 CMOS inverter
24 power clamp MOS
25 resistance element
26 capacitance element
31 power supply line
32 ground line
33 PFET
34 NFET
111 well region
121 source region
122 drain region
123 gate insulation film
124 gate electrode
125 contact portion
141 silicide block
151 contact portion

The invention claimed is:

1. A semiconductor integrated circuit, comprising:
   a first resistance element,
   a first capacitance element, wherein
      the first resistance element and the first capacitance element are connected in series, and
      the first resistance element and the first capacitance element are connected between a power supply line and a ground line;
   an inverter that includes an input terminal and an output terminal, wherein the input terminal of the inverter is connected between the first resistance element and the first capacitance element;
   a well region;
   a MOS transistor on the well region, wherein the MOS transistor includes:
      a gate electrode connected to the output terminal of the inverter;
      a drain electrode connected to the power supply line; and
      a source electrode connected to the ground line; and
   a current limit element between the well region and the gate electrode.

2. The semiconductor integrated circuit according to claim 1, wherein
   the current limit element includes a second resistance element, and
   the second resistance element is different from the first resistance element.

3. The semiconductor integrated circuit according to claim 2, wherein the gate electrode is the second resistance element.

4. The semiconductor integrated circuit according to claim 2, wherein
   the second resistance element includes a silicide block, and
   the silicide block is on the gate electrode.

5. The semiconductor integrated circuit according to claim 2, wherein
   each of both ends of the gate electrode includes a corresponding contact portion,
   the output terminal of the inverter is connected to the corresponding contact portion of the each of the both ends of the gate electrode,
   the well region is connected to a specific contact portion,
   the specific contact portion is at a proximity of a center of the gate electrode, and
   the specific contact portion is different from the corresponding contact portion of the each of the both ends of the gate electrode.

6. The semiconductor integrated circuit according to claim 1, wherein
   the current limit element includes a second capacitance element, and
   the second capacitance element is different from the first capacitance element.

7. The semiconductor integrated circuit according to claim 6, wherein the second capacitance element is a MOS capacitor.

8. The semiconductor integrated circuit according to claim 1, wherein
   the current limit element includes a second resistance element and a second capacitance element,
   the second resistance element is different from the first resistance element, and
   the second capacitance element is different from the first capacitance element.

9. The semiconductor integrated circuit according claim 8, wherein the second resistance element and the second capacitance element are connected in parallel.

10. The semiconductor integrated circuit according to claim 8, wherein the gate electrode is the second resistance element.

11. The semiconductor integrated circuit according to claim 8, wherein
    the second resistance element includes a silicide block, and
    the silicide block is on the gate electrode.

12. The semiconductor integrated circuit according to claim 8, wherein the second capacitance element is a MOS capacitor.

13. The semiconductor integrated circuit according to claim 8, wherein
    each of both ends of the gate electrode includes a corresponding contact portion,
    the output terminal of the inverter is connected to
       the corresponding contact portion of the each of the both ends of the gate electrode, and
       a specific contact portion at a proximity of a center of the gate electrode,
    the specific contact portion is different from the corresponding contact portion of the each of the both ends of the gate electrode,
    the corresponding contact portion of the each of the both ends of the gate electrode is directly connected to the well region, and
    the specific contact portion is connected to the well region via the second capacitance element as the current limit element.

14. A semiconductor integrated circuit, comprising:
    a resistance element;
    a capacitance element, wherein
       the resistance element and the capacitance element are connected in series, and
       the resistance element and the capacitance element are connected between a power supply line and a ground line;
    an inverter that includes an input terminal and an output terminal, wherein the input terminal of the inverter is connected between the resistance element and the capacitance element;
    a well region;
    a MOS transistor on the well region, wherein the MOS transistor includes:
       a gate electrode connected to the output terminal of the inverters;
       a drain electrode connected to the power supply line; and
       a source electrode connected to the ground line; and
    a current limit element between the well region and the gate electrode wherein the current limit element is configured to:
       limit a current that flows into the inverters, and
       increase a potential in the well region to accelerate an ON operation of the MOS transistor.

* * * * *